United States Patent [19]

Congdon

[11] 4,356,445
[45] Oct. 26, 1982

[54] METHOD AND APPARATUS FOR DRIVING AIR CORE METER MOVEMENTS

[75] Inventor: James S. Congdon, Santa Clara, Calif.

[73] Assignee: Cherry Semiconductor Corporation, Cranston, R.I.

[21] Appl. No.: 168,372

[22] Filed: Jul. 10, 1980

[51] Int. Cl.³ ............................................. G01R 23/00
[52] U.S. Cl. ........................................ 324/82; 324/85
[58] Field of Search .................... 324/78 R, 78 E, 82, 324/85, 140 R

[56] References Cited

U.S. PATENT DOCUMENTS

| | | | |
|---|---|---|---|
| 1,076,448 | 10/1913 | Pratt | 324/82 |
| 2,532,890 | 12/1950 | Castle | 324/85 |
| 3,122,704 | 2/1964 | Jones | 324/82 |
| 3,160,815 | 12/1964 | Ford et al. | 324/82 |
| 3,344,350 | 9/1967 | Stoft | 324/82 |
| 3,502,976 | 3/1970 | Chamberlin et al. | 324/82 |

*Primary Examiner*—Michael J. Tokar
*Attorney, Agent, or Firm*—Charles E. Pfund

[57] ABSTRACT

Method and circuitry for generating signals in response to an input signal whose frequency or pulse rate is to be measured, which signals are directly applicable to the coils of an air core type meter movement or the like to provide an output indication of the frequency or pulse rate of the input signal. The signals applied to the air core meter are generated directly from the input signal and include sine and cosine signals synchronous with the input signal. A preferred embodiment is disclosed which includes circuitry which produces staircase waveforms, which when integrated, produce the required sine and cosine signals to drive an air core meter movement in response to a periodic input signal.

19 Claims, 8 Drawing Figures

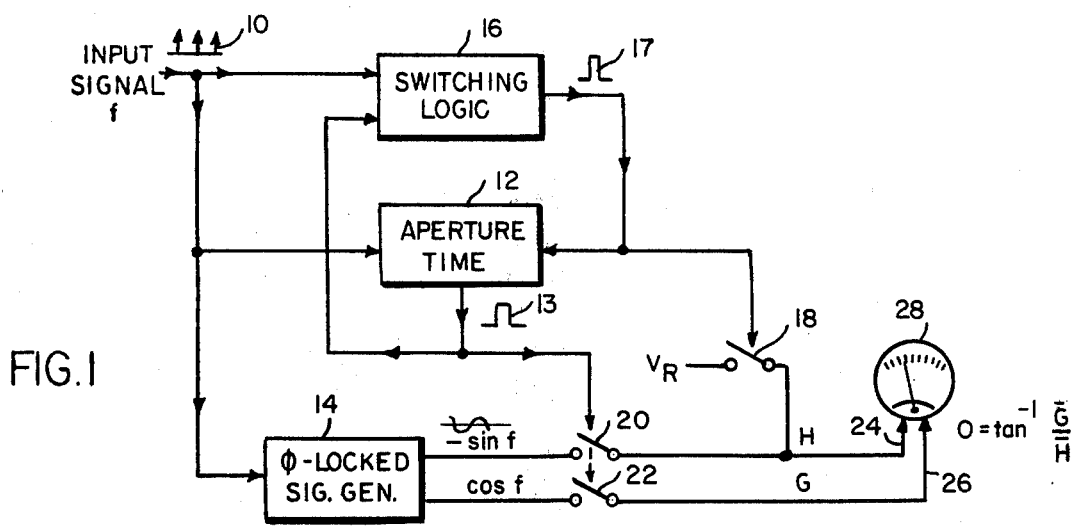
FIG.1
FIG.2
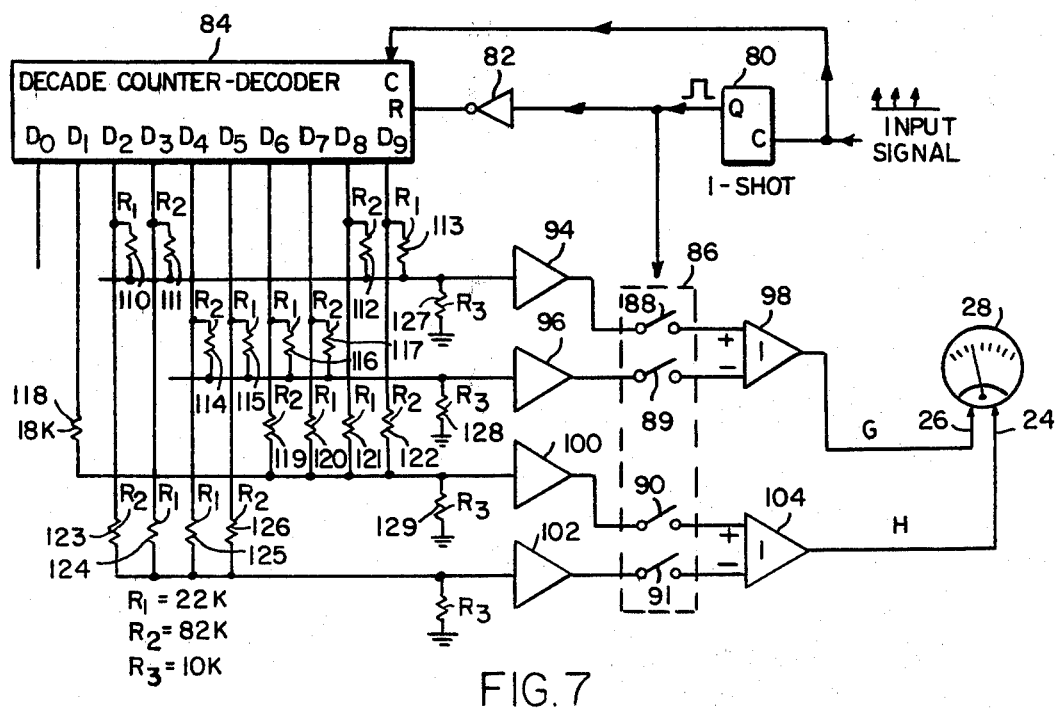
FIG.7 though the same as in the original. The sine waveform is applied to the second coil of the air core meter. When integrated by the air core meter, this waveform produces a component proportional to the cosine of the input frequency plus a second component inversely proportional to the input frequency. A second waveform is applied to the second coil of the air core meter whose amplitude is fixed and whose duration is directly proportional to the period of the input waveform. By

METHOD AND APPARATUS FOR DRIVING AIR CORE METER MOVEMENTS

FIELD OF THE INVENTION

This invention is related to measurement circuits, and in particular to circuits for driving air core type meter movements.

BACKGROUND OF THE INVENTION

Air core type meter movements and similar actuators have cost and ruggedness advantages over other types of meter movements. A disadvantage of air core movements which has kept them from being more widely used has been the requirement by such a meter for two input signals which sum vertorially and which determine the angle of deflection of the pointer. In other words, two signals whose ratio is the tangent of the desired deflection angle must be provided and respectively applied to the meter movement coils. Thus, if a voltage representative of a quantity is to be measured, two separate non-linear coil driver circuits are required to provide signals proportional to the sine and the cosine of the voltage to be measured.

In applications where a measurement of frequency or pulse rate is to be performed, such as in a tachometer, a frequency-to-voltage converter is frequently first used to provide an analog signal representative of the frequency or pulse rate. This voltage is then applied to the two coil-driver circuits whose outputs are proportional to the sine and the cosine of the input signal. The outputs may take the form of DC signals or periodic waveforms whose time average approximates the desired signals. These sine and cosine signals are then applied to the meter movement coils to provide the desired deflection of the meter needle.

SUMMARY OF THE INVENTION

The present invention includes a method and circuitry for generating two signals in response to an input signal whose frequency or pulse rate is to be measured, the two signals being directly applicable to the coils of an air core type meter movement to provide an output indication of the frequency or pulse rate of the input signal. In the present invention, the two signals applied to the air core meter are generated directly from the input signal and provide two independent signals representative of the sine and the cosine of the frequency of the input signal.

Briefly, a monostable or other timing device is triggered in response to a clock pulse derived from the input signal. The monostable defines an aperature time having fixed length and beginning synchronously with respect to the input signal. In response to the input signal, sine and cosine waveforms are generated synchronously with the input waveform. The cosine waveform is applied directly to one coil of the air core meter movement; and when integrated by the mechanical integration of the meter, this signal is representative of the sine of the input frequency. The sine waveform is applied to the second coil of the air core meter. When integrated by the air core meter, this waveform produces a component proportional to the cosine of the input frequency plus a second component inversely proportional to the input frequency. A second waveform is applied to the second coil of the air core meter whose amplitude is fixed and whose duration is directly proportional to the period of the input waveform. By selecting the appropriate polarity and scaling factor for this signal, it may be used to cancel the unwanted second component in the air core meter second coil resulting from the integration of the sine waveform. A preferred embodiment is disclosed which includes circuitry which produces a staircase approximation to the sine and cosine waveforms. In this manner, very simple and inexpensive circuitry directly provides the signals required to drive an air core meter movement in response to a periodic input signal.

DESCRIPTION OF THE DRAWINGS

The operation and advantages of the present invention will become more clear upon reading the following detailed description of the preferred embodiment in conjunction with the accompanying drawings of which:

FIG. 1 is a block diagram which illustrates the operational principles of the present invention;

FIGS. 2, 3, 4, 5 and 6 are waveforms useful in explaining the operation of the circuit shown in FIG. 1;

FIG. 7 is a schematic diagram of an alternate embodiment of the invention; and

DESCRIPTION OF THE PREFERRED EMBODIMENT

Figure 3:
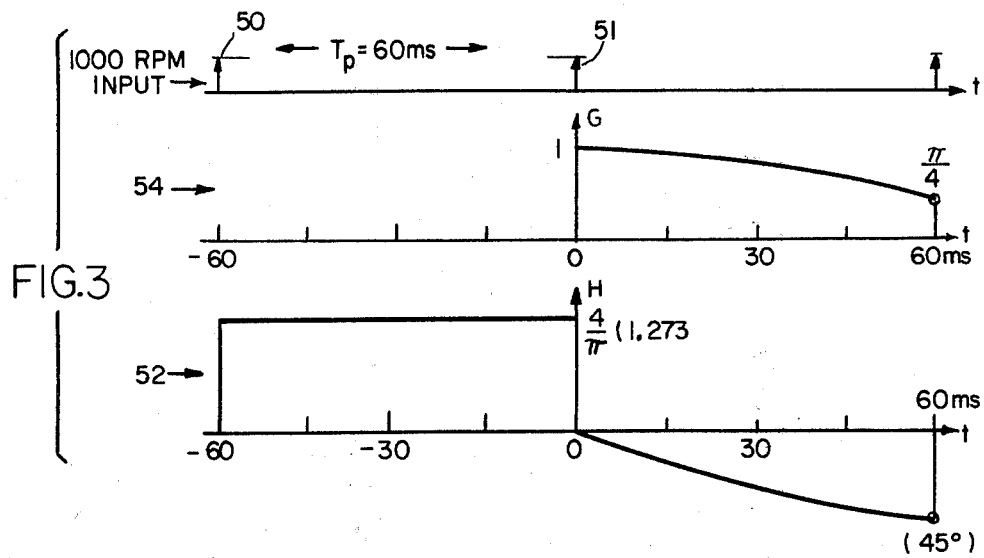

As explained above, air core type meter movements require two separate input signals, the ratio between which is equal to the tangent of the desired deflection angle. Prior art methods of producing such signals have required relatively complex, non-linear, function generating circuits. In applications where measurement of a frequency or pulse rate is desired, such as tachometers, such circuitry requires an additional frequency-to-voltage conversion circuit to generate the voltage representation of the pulse rate which is applied to the non-linear coil driver circuits.

The present invention generates two signals whose average values are in the desired ratio without requiring the intervening frequency-to-voltage conversion. The present invention has further advantages over the prior art in that it is much simpler and less costly than the non-linear coil driving circuits which it replaces. The embodiment described below is adapted for an input signal in the form of a series of pulses, but modifications to this embodiment will be obvious to those of ordinary skill in the art for applying the teaching of the present invention to frequency or period measuring applications. FIG. 1 is a block diagram of an idealized system constructed in accordance with the present invention. A specific circuit diagram for one preferred embodiment is shown and described below, but the operation of the invention is most easily explained with reference to FIG. 1.

Referring to FIG. 1, an input signal 10 is shown which consists of a series of pulses. Such a signal might be produced, for example, in response to a rotating device whose speed of rotation is to be measured. In the present example, each pulse corresponds to one rotation of the device in question. The input signal 10 is applied to an aperture timer 12. In response to pulses applied to its input, aperture timer 12 provides a pulse at its output having a fixed length. The length of the output pulse from aperture timer 12 determines the full scale pulse rate which may be measured by a particular circuit. The selection of the aperture pulse length will become apparent as the circuit operation is explained below.

Input signal 10 is also applied to the input of a circuit 14, such as a phase-locked signal generator which provides sine and cosine analog waveforms as its output which are proportional in frequency to and synchronized with the pulses of input signal 10. Other circuits may be used to implement block 14, the phase-locked signal generator being only one type of such circuit.

The input signal 10 is also applied to switching logic 16. Switching logic 16 also receives as an input the output pulse from aperture timer 12. Switching logic 16 provides an initializing pulse 17 which controls switch 18 to periodically apply a predetermined reference voltage $V_R$ to input 24 of an air core meter 28.

The two signals applied to inputs 24 and 26 of air core meter 28 shall be respectively designated as the H and G signals, and in response to such signals, the needle will deflect by an angle $\theta$, where $\theta$ equals $\tan^{-1}(\overline{G}/\overline{H})$ where $\overline{G}$ and $\overline{H}$ are the time averages of the G and H signals.

In response to the aperture pulse 13 from aperture timer 12, switch 22 connects the cosine output signal from phase-locked signal generator 14 to input 26 of the air core meter; and similarly, switch 20 is responsive to the aperture pulse 13 from the aperture timer 12 to apply the minus sine output from phase-locked signal generator 14 to input 24 of the air core meter. Input 24 to the air core meter is also periodically connected to a reference voltage $V_R$ by switch 18 in response to signals from switching logic 16.

FIG. 2 shows waveforms which are helpful in explaining the timing relationship between the various signals present in the circuit of FIG. 1. The top waveform shown in FIG. 2 is representative of an input signal 10 and consists of a series of pulses. The middle waveform in FIG. 2 represents the aperture pulse 13 from aperture timer 12, and the bottom waveform represents the initializing pulse 17 produced by switching logic 16.

The circuit shown in FIG. 1 responds to the input signal 10 by providing periodic waveforms denoted as G and H, the average values of which $\overline{H}$ and $\overline{G}$, are in the proper relationship to provide a linear deflection of meter 28 in response to changes in the frequency of input signal 10. To begin a cycle, the output signals from aperture timer 12 and control logic 16 are both low following the completion of the previous cycle, as shown at time $T_0$ in FIG. 2. In response to the first input pulse following the end of the previous cycle, the initializing pulse output from control logic 16 goes high. This is shown at time $T_1$ in FIG. 2. The output from control logic 16 remains high for one period of the input signal and returns low in response to the next occurring input pulse. This is shown at $T_2$ in FIG. 2. Also at time $T_2$, the aperture pulse produced by aperture timer 12 goes high, as shown in FIG. 2. The width of aperture pulse 13 determines the maximum input frequency which is measured and in general is selected to have a constant duration for each particular application.

After aperture pulse 13 goes high in response to a pulse of input signal 10 at time $T_2$, the aperture pulse 13 remains high for a fixed period of time and returns low at time $T_3$, as shown in FIG. 2. The frequency of the input pulse train 10 varies as a function of the measured value, and thus, a variable number of input pulses will occur during the period that aperture pulse 13 is high. At the end of the aperture period, aperture pulse 13 returns to its low state at time $T_3$. This completes one cycle of the measurement process. After aperture pulse 13 returns low at time $T_3$, the initializing pulse 17 will go high in response to the next occurring input pulse, and the above described procedure is repeated.

The operation of the circuit shown in FIG. 1 is most easily explained by following the signals provided by the circuit in response to input signals of different frequencies. FIGS. 3 thru 6 show the waveforms present in the circuit of FIG. 1 for such different input signals. In the examples of FIGS. 3-6, it is assumed that the rotational speed of an object is being measured and that one pulse per revolution is produced by the rotating object. The pulse width of the aperture pulse from aperture timer 12 is 60 milliseconds, which results in a full scale (360°) measurable input frequency of 8,000 revolutions per minute for reasons which will become clear below.

The phase-locked signal generator 14 provides sine and cosine signals which are synchronous with the input signal pulses. In the present example, phase-locked signal generator 14 provides sine and cosine waveforms which have a frequency such that one cycle of the output signals from phase-locked signal generator 14 occurs for each 8 pulses in the input signal. In other words, the time between input signal pulses equals 45° of the output signals from phase-locked signal generator 14.

Referring to FIG. 3, the top line shows input pulses which correspond to a rotational speed of 1,000 RPM, or a time $T_p$ between pulses of approximately 60 milliseconds. In response to the first input pulse 50 of a sequence, the output from switching logic 16 goes high causing switch 18 to connect input 24 of meter 28 to the reference voltage $V_R$. For output signals from phase-locked signal generator having a unity amplitude, the value of $V_R$ should be selected to be $4/\pi$. This is shown by waveform 52 which is high from a time of $-60$ milliseconds to 0 milliseconds. In response to the next input pulse 51, the initialization pulse from control logic 16 returns low and switch 18 opens. Simultaneously, the aperture pulse from aperture timer 12 causes switches 20 and 22 to close, respectively applying the sine and cosine output signals from phase-locked signal generator 14 to the inputs of the air core meter. The phase-locked generator output signals are shown in FIG. 3 by waveforms 52 and 54 for $t > 0$. Waveform 52 represents the sine signal applied as the H input to the air core meter and waveform 54 represents the cosine signal applied as the G input to the air core meter. As described above, for a reference voltage of $4/\pi$, the sine and cosine signals have an amplitude of one, as shown in FIG. 3. At the end of 60 milliseconds, the aperture interval, switches 20 and 22 are opened and the G and H signals applied to the meter return to zero where they remain until the beginning of the next cycle.

The meter response is filtered by the mechanical inertia of the meter, and the meter deflection is determined by the average amplitudes of the signals applied to the meter inputs. The average values of each of the G and H signals may be determined by integrating the signals over a period of time and dividing the resulting value by the time period. Since the G and H waveforms are being averaged over the identical time period and since it is the ratio of the two signals which determines the meter deflection, the time period factor may be omitted in the following calculations, so long as it is the same for both signals.

The average value of the H signal, denoted as $\overline{H}$, may be calculated by separately computing the integrals of the left-and right-hand portions of the waveform 52. Taking the phase $\phi$ of the input signal in radians as the integration variable, the area of right-hand portion of waveform 52 is proportional to $$\int_{\phi=0}^{\frac{\pi}{4}} -\sin\phi\, d\phi = \left[\cos\phi\right]_0^{\frac{\pi}{4}} = 0.707 - 1 \quad (1)$$

The area under the left-hand portion of waveform 52 is proportional to $$\int_{-\frac{\pi}{4}}^{0} \left(\frac{4}{\pi}\right) d\phi = \left[\frac{4}{\pi}\cdot\phi\right]_{-\frac{\pi}{4}}^{0} = 1 \quad (2)$$

It can be seen that by choosing $4/\pi$ for the value of the reference voltage $V_R$, the integral of the left-hand portion of waveform 52 has a value which cancels the unity term in equation (1) from the right-hand portion of waveform 52, and the average value of the G waveform is proportional to cos 45° or 0.707.

By inspecting waveform 54, it can be seen that the average value $\overline{G}$ of waveform 54 is proportional to $$\overline{G} = \int_{\phi=0}^{\frac{\pi}{4}} \cos\phi\, d\phi = \left[\sin\phi\right]_0^{\frac{\pi}{4}} = 0.707 \quad (3)$$

The ratio of $\overline{G}/\overline{H}$ is 1 or the tangent of 45°. The needle deflection is 45°/360°, or ⅛ of the full scale (8000 rpm) deflection which indicates the correct speed of 1000 rpm.

Figure 4:
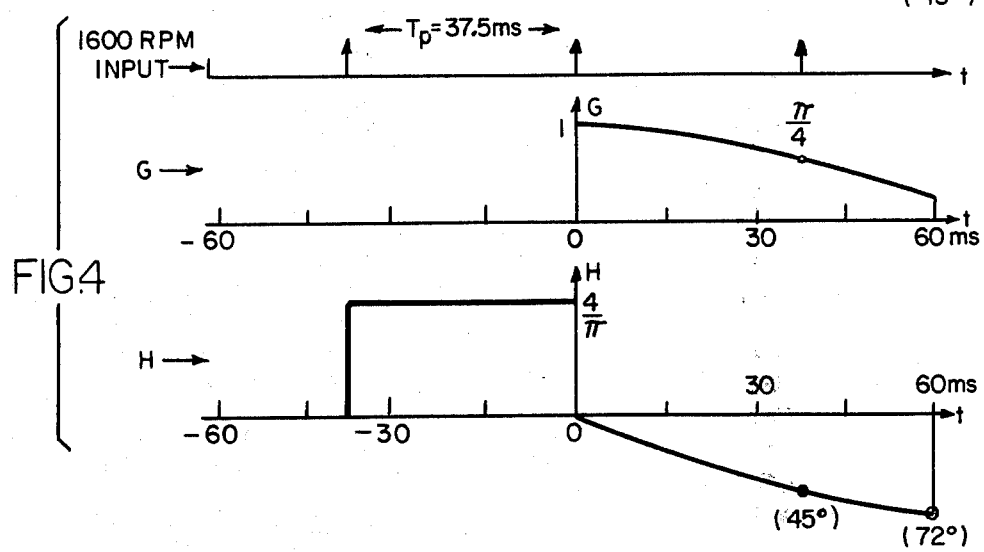

FIG. 4 shows the same waveforms as shown in FIG. 3 except for an input signal of 1600 pulses per minute, corresponding to a rotational speed of 1600 rpm. The integral of the left-hand portion of the H waveform is again one. This is due to the face that the reference voltage is always applied to the meter for one period of the input pulse stream, which is always 45° (or $\pi/4$ radians) in terms of the integration variable. The area under the right half of the H waveform is proportional to ((cos 72°)−1). The total area under the H waveform is thus proportional to cos 72°. The area under G waveform is proportional to sine 72°. Taking the ratio of $\overline{G}/\overline{H}$ Sin 72°/cos 72° which is the tangent of 72°, which indicates a rotational speed of 72°/360°×8000 rpm or 1600 rpm.

Figure 5:
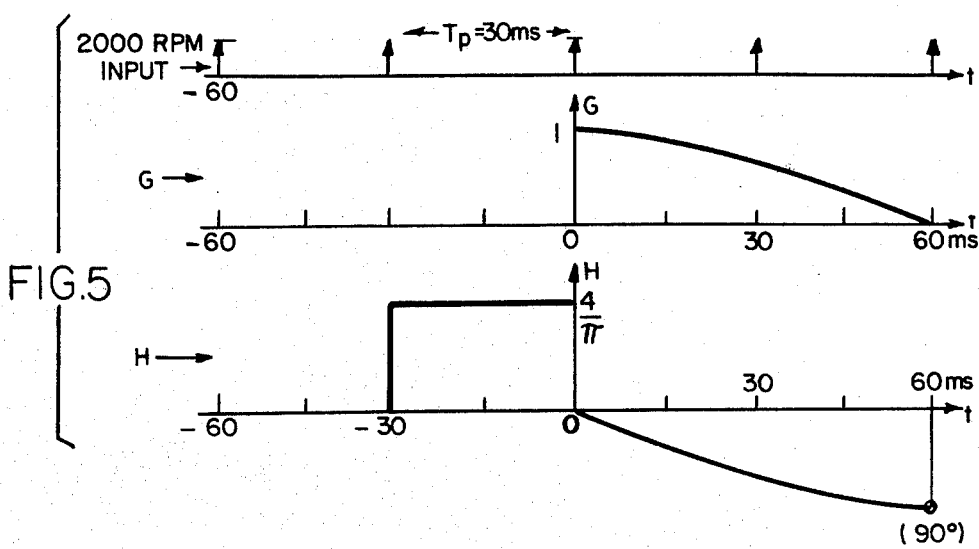
Figure 6:
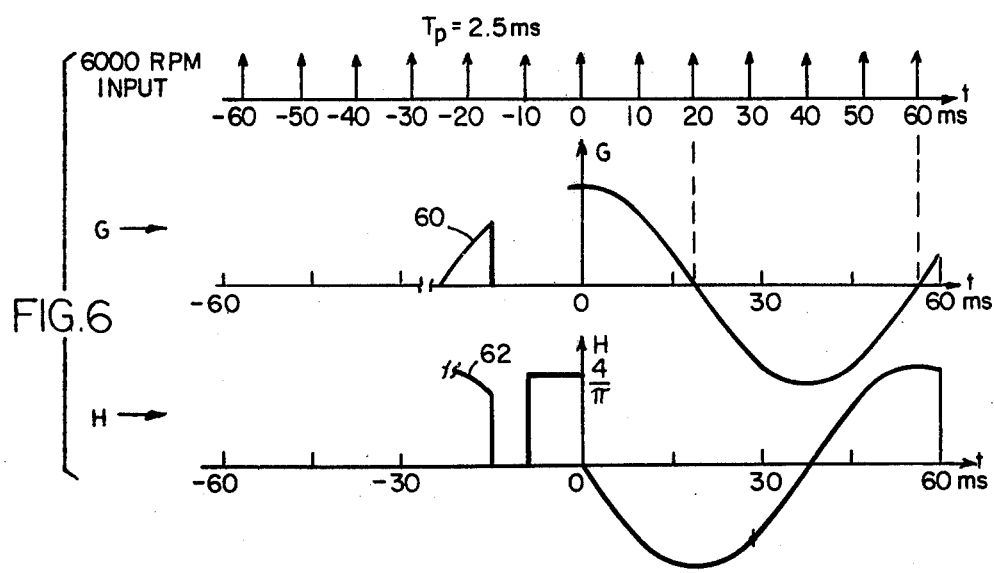

FIGS. 5 and 6 illustrate the waveforms for input signals corresponding to 2000 and 6000 rpms. In FIG. 5, the average value of the H signal is equal to zero. While the ratio of $\overline{G}/\overline{H}$ is infinite, the tangent of infinity is ninety degrees, as desired.

The circuit of FIG. 7 shows one implementation by which the advantages of the present invention may be simply realized using inexpensive circuitry. The circuit of FIG. 7 is suitable for being manufactured as an integrated circuit, which would result in further cost reductions. The circuit shown in FIG. 7 provides staircase approximations of the required sine and cosine waveforms. While such approximations result in the introduction of some error in the meter reading, its accuracy is adequate for most applications.

The circuit of FIG. 7 is adapted for use with an input signal in the form of a series of pulses whose frequency is proportional to the measured variable. These pulses are applied to the clock input of a monostable circuit 80. Monostable 80 may be implemented by means of many available devices, such as a 555 integrated circuit. In response to a rising edge applied to the clock input of monostable 80, a pulse of a fixed duration is produced at the Q output thereof. The output pulse from monostable 80 corresponds with the aperture pulse 13 from aperture timer 12 and defines the aperture period.

The input signal is also applied to the clock input of a decade counter-decoder 84, such as a 4017 type integrated circuit. Counter 84 has ten outputs designated as $D_0$ through $D_9$. In response to successive clock pulses applied to the clock input of counter 84, the counter sequentially counts through each of its ten possible states with the appropriate output $D_n$ going high to indicate that the counter is in the nth state. The aperture pulse from monostable 80 is inverted by an inverter 82 and applied to the reset input of counter 84. During periods when monostable 80 is not activated, the low Q output from monostable 80 is inverted by inverter 82 and applied to the reset input of counter 84 maintaining it in the "zero" or $D_0$ state. When an input signal pulse is applied to monostable 84, the output from monostable 80 goes high and the reset input to counter 84 goes low, enabling the counter to count in response to subsequent input signal pulses applied to the clock input of counter 84.

The output from monostable 80 is also applied to an electronic switching circuit 86 which includes four single pole switches 88 through 91 which are electronicly opened or closed in response to the output state of monostable 80. Electronic switch 86 may be implemented, for example, by a 4016 type integrated circuit. Switches 88 and 89 connect the outputs of two buffer amplifiers 94 and 96 to the inverting and non-inverting inputs of a unity-gain, differential amplifier circuit 98. The output of amplifier 98 is applied to one input 26 of air core meter 28. Similarly to switches 88 and 89, switches 90 and 91 connect the output of two buffer amplifiers 100 and 102 to the inputs of a second unity-gain, differentail amplifier circuit 104. The output of amplifier 104 is applied to the second input 24 of meter 28.

The inputs to buffer amplifiers 94, 96, 100 and 102 are each connected to selected outputs of counter 84 via a plurality of resistors 110 through 126. In response to successive clock pulses applied to counter 84, the outputs of counter 84 sequentially go high. The resistor voltage dividers connecting the outputs of counter 84 to the inputs of the buffer amplifiers are chosen to provide a staircase approximation to sine and cosine signals at the outputs of differential amplifiers 98 and 104. These resistor divider ratios ideally should have the following relationships:

$R_3/(R_3+R_1) \sim 1$; $R_3/(R_3+R_4) \sim 4/\pi$; and $R_3/(R_2+R_3) \sim (4/\pi - 1)$.

The resistor ratios used in the embodiment shown in FIG. 7 depart from these ideal values due to the use of available standard resistor values. This has a second order effect on the accuracy of the embodiment and does not interfere with the teaching of the patent. The generation of the staircase approximation to the sine and cosine signals is accomplished in the following manner.

During the period that monostable 80 is activated, the output of buffer amplifier 94 is connected to the non-inverting input of differential amplifier 98, and positive signals applied to the input of buffer amplifier 94 result in corresponding positive signals from amplifier 98. During this time, the output of buffer amplifier 96 is applied to the inverting input of amplifier 98, and positive signals applied to the input of amplifier 96 result in corresponding signals at the output of amplifier 98 having a negative polarity. As decade counter 84 counts through each of its states, the appropriate signals are applied to the inputs of amplifiers 94 and 96 to provide a staircase approximation to a cosinusoidal waveform at the output of amplifier 98. This can be more easily seen by reference to the staircase approximation waveform shown in FIG. 8. During the time that the $D_2$ output is high, the voltage applied to the input of amplifier 94 is determined by the values of resistors 110 and 127 is equal to the output voltage of counter 84 divided by the ratio $R_3/(R_1+R_3)$, or 10/32 when $R_1$ and $R_3$ are 22 and 10 kilohms, respectively. Thus, the output from amplifier 98 during the $D_2$ time period will be proportional to 10/32, as shown by segment 200 of the waveform shown in FIG. 8. In response to the next clock pulse, the $D_2$ output of counter 84 goes low and the $D_3$ output goes high. The resistor 111 connecting the $D_3$ output to the input of amplifier 94 has a value $R_2$ equal to 82 Kilohms. The output signal from amplifier 98 is thus proportional to $R_3/(R_2+R_3)$ or 10/92. This is shown by segment 202 in the waveform shown in FIG. 8. During time period $D_4$, the $D_4$ output of counter 84 is connected to the input of amplifier 96 by resistor 114 having a value $R_2$. Similarly to the $D_3$ time period, the value applied to the input of amplifier 96 is equal to 10/92. However, the output of amplifier 96 is applied to the inverting input of amplifier 98, and the output of amplifier 98 during the $D_4$ time period is proportional to $-10/92$, as shown by segment 204 of the waveform shown in FIG. 8.

Figure 8:
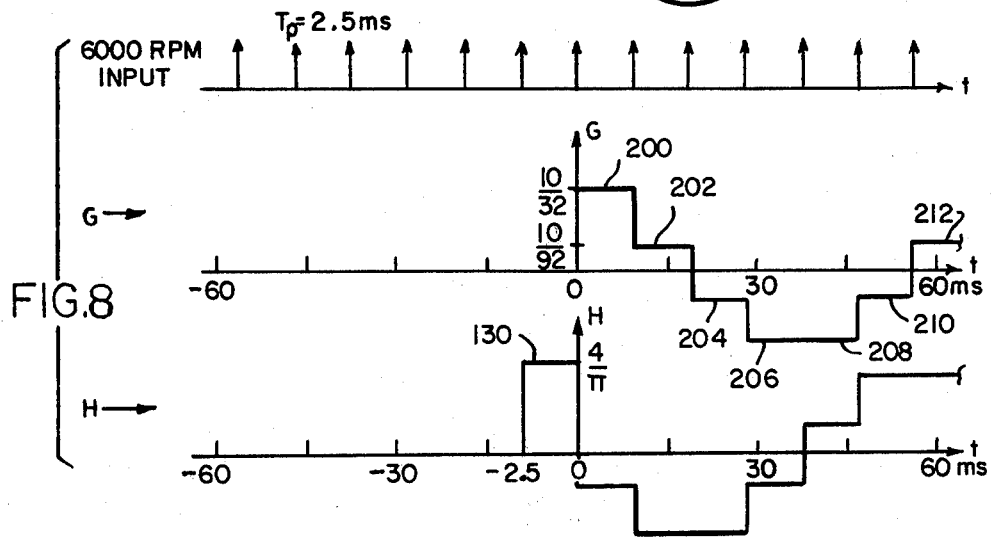
FIG. 8 shows a waveform useful in explaining the operation of the circuitry shown in FIG. 7.

During the $D_5$ through $D_9$ time periods, the $D_5$ through $D_9$ outputs of counter 84 are applied through resistors 112–113 and 115–117 to the inputs of amplifiers 94 and 96 to produce the remaining segments 206–212 of the waveform shown in FIG. 8. As can be seen from an inspection of FIG. 8, the output signal from amplifier 98 is a staircase approximation of a cosine signal which is synchronous with the input signal pulses.

In the same manner as described above, the $D_2$ through $D_9$ outputs from counter 84 are applied to the inputs of amplifiers 100 and 102 through resistors 119–126. The resistor values and connections are changed, however, as shown in FIG. 7 to produce a sine waveform approximation at the output of differential amplifier 104 rather than the cosine waveform produced at the output of amplifier 98.

An additional resistor 118 connects the $D_1$ output of counter 84 to the input of amplifier 100. Resistor 118 has a value of approximately 18 kilohms and provides an input to amplifier 100 during the $D_1$ time period corresponding to the initializing pulse portion of the H waveforms shown in FIGS. 3 through 6.

The circuit of FIG. 7 operates in the following manner. In response to the first clock signal following the completion of a previous cycle, monostable 80 is triggered. The output of monostable 80 then goes high closing switches 86 and removing the reset signal applied by inverter 82 to counter 84. In response to the next clock signal, counter 84 increments from the $D_0$ state to the $D_1$ state. During the periods that the counter is in the $D_1$ state, a constant value signal is applied as the H signal to input 24 of meter 28, corresponding to the initialization pulse portion of the H waveform shown in FIGS. 3–6. During this period the G signal applied to input 26 of meter 28 is zero. In response to the next input signal pulse, counter 84 goes from the $D_1$ to the $D_2$ state. Thus, the duration of the initialization pulse provided by resistor 118 is equal to one period between input pulses, in accordance with the above described explanation of the circuit operation. Decade counter 84 will continue to increment through states $D_2$ through $D_9$ in response to input signal pulses until the aperture pulse from monostable 80 goes low. When monostable 88 times out and its output goes low, decade counter 84 is reset and returns to the $D_0$ state. The end of the aperture pulse also opens switches 86 connecting the buffer amplifiers 94, 96, 100, and 102 to the meter 28.

During the time that the output from monostable 80 is high, defining the aperture period, decade counter-decoder 84 is clocked by the input signal to provide sine and cosine waveforms at the outputs of amplifiers 104 and 98 which waveforms are synchronized with the input signal pulses, as described above in detail. Thus, the circuit of FIG. 7 is a simple implementation of the circuit shown in FIG. 1.

It should be appreciated that the initialization pulse period is subtracted from the aperture period by the circuit of FIG. 7 due to the fact that monostable 80 is triggered by the initial input pulse of a cycle. This results in a small error at low frequencies, which in most applications is negligible. The input signal applied to the monostable 80 may be gated by means of signals coming from counter 84 or other equivalent circuits may be used to eliminate this problem in applications where low frequency accuracy is important.

The step approximations produced by the circuit of FIG. 7 necessarily result in deviations from the signals shown in FIGS. 3–6 where the G and H waveforms are continuous. However, the eight-segment approximation produced by the circuit of FIG. 7 introduces a peak error of less than 1.5° and is therefore adequate for most applications.

The timing normalization (8 pulses being equal to one cycle or 360°) may be varied in the present invention. Where more pulses are used, the initializing pulse must be of greater amplitude, needle jitter is greater, and theoretical accuracy is improved. The opposite is true if fewer pulses are used per cycle.

Other possible modifications include increasing the coil peak drive level as the deflection angle increases to compensate for the drop in torque which occurs in the simple systems. Mechanical integration and averaging has been assumed in this application; however, electrical integration or filtering of a more sophisticated type could be employed. Since most of the needle jitter is in a limited bandwidth, band rejection filtering may also be used to reduce this jitter.

The above description has disclosed a unique circuit concept for providing the necessary signals to drive an air core type meter movement, and this unique circuitry has numerous advantages over circuits previously known for performing such a function. Modifications to the specific embodiments disclosed herein will be obvious to those of ordinary skill in the art, and thus the scope of the present invention is not to be construed as being limited by the disclosure herein of certain preferred embodiments; and the present invention should be construed only in accordance with the following claims.

What is claimed is:

1. Circuitry for providing, in response to a periodic input signal of variable frequency, first and second output signals suitable for driving an air core meter means to provide a meter deflection indicative of the frequency of the input signal, comprising:
   means, responsive to the input signal, for providing first and second signals which are respectively representative of cosine and negative sine waveforms, and which have a predetermined phase relationship with the input signal;
   means, responsive to the input signals, for providing a pulse signal having a duration which is determined by the period of the input signal;
   means for applying a reference signal to the meter for the duration of the pulse signal;
   means for defining an aperture interval following the end of said pulse signal; and
   means for applying the first and second waveforms to the meter during the aperture interval.

2. Circuitry for providing, in response to a periodic input signal of variable frequency, first and second output signals suitable for application to an air core meter means, having first and second input terminals, to provide an output indication of the frequency of the input signal, comprising:
   means, responsive to the input signal, for defining an initialization period having a duration determined by the frequency of the periodic input signal;
   means, responsive to the input signal, for providing first and second signals representative of cosine and inverted sine waveforms synchronous with the periodic input signals;
   means for defining an aperture period following said initialization period;
   means for applying a reference signal to the second input terminal during the initialization period;
   means for applying the first signal to the first input terminal and for applying the second signal to the second input terminal during the aperture period; and
   means for controlling the above-mentioned means to cause the circuitry to repetitively define initialization and aperture periods in response to the input signal so as to provide the first and second output signals representative of the frequency of the periodic input signal.

3. Circuitry responsive to a periodic input signal of variable frequency for providing first and second output signals of the frequency of the input signal, comprising:
   first and second terminals at which the first and second output signals are provided;
   means, responsive to the input signal, for providing first and second signals which are respectively representative of cosine and negative sine waveforms, and which have a predetermined phase relationship with the input signal;
   means, responsive to the input signal, for providing a pulse signal having a duration which is determined by the period of the input signal;
   means for applying a reference signal to the second terminal for the duration of the pulse signal;
   means for defining an aperture interval following the end of said pulse signal; and
   means for applying the first and second waveforms to the first and second terminals respectively during the aperture interval.

4. The circuitry of claims 1, 2, or 3 wherein the first and second output signals are such that the arctangent of the ratio of the signals is substantially proportional to the input frequency.

5. The circuitry of claims 1, 2, or 3 wherein the first and second signal providing means includes:
   counter means responsive to the periodic input signal for sequentially counting through a plurality of states, said counter means having a plurality of outputs representative of the state of the counter; and
   signal means responsive to the plurality of counter outputs for providing signals representative of sine and cosine waveforms which are synchronous with the periodic input signal.

6. The circuitry of claim 5 wherein the signal means includes a resistive network connected to the counter outputs so as to provide staircase approximations of sine and cosine waveforms in response to and synchronous with successive counter outputs representative of sequential states of the counter.

7. The circuitry of claim 6 further including first and second amplifiers;
   and wherein the resistive network includes a plurality of resistors, each connected to an output of the counter circuit and an input terminal of one of the first and second amplifiers.

8. The circuitry of claim 7 wherein the first and second amplifiers are differential amplifiers having inverting and non-inverting inputs thereto;
   and wherein individual ones of the plurality of resistors are connected to the inverting and non-inverting inputs of the first and second differential amplifiers to provide negative and positive portions of the sine and cosine waveform approximations.

9. The circuitry of claim 8 wherein the first and second output signals are such that the arctangent of the ratio of the signals is proportional to the input frequency.

10. Apparatus for providing, in response to a periodic input signal of variable frequency, first and second output signals suitable for driving an air core meter to produce a meter deflection indicative of the frequency of the input signal, comprising:
    first and second output terminals at which the first and second output signals are respectively provided;
    timer means responsive to input signal for providing a pulse signal of a predetermined duration to said terminals;
    means responsive to the pulse signal and to the input signal for providing sine and cosine staircase approximation signals which vary in frequency in accordance with the frequency of the input signal, including:
    a counter having a clock input and having a plurality of outputs which are sequentially activated in response to signals applied to the clock input;
    means for applying the periodic input signal to the counter clock input;
    a first plurality of resistors connecting selected ones of the counter outputs to the first amplifier circuit, the first plurality of resistors having values so as to provide an output signal from the first amplifier circuit which is a staircase approximation of a negative sine wave as the counter is incremented by signals applied to the counter clock input;

a second plurality of resistors connecting selected ones of the counter outputs to the second amplifier circuit, the second plurality of resistors having values so as to provide an output signal from the second amplifier circuit which is a staircase approximation to a cosine waveform as the counter is incremented by signals applied to the counter clock input; and a resistor connecting one of said counter outputs to the first amplifier circuit for applying thereto an initial pulse signal of a predetermined amplitude for a period determined by the frequency of the input signal; and switching means responsive to the timer means output signal for applying the output signals from the first and second amplifier circuits to the first and second output terminals respectively following the initial pulse signal.

11. The apparatus of claim 10 wherein the counter includes a decade counter-decoder having ten states and having ten outputs, one and only one of which is high to designate the present state of the counter.

12. The apparatus of claim 10 wherein the first plurality of resistors includes eight resistors having values chosen so as to provide a four-level staircase approximation of a sine waveform; and wherein the second plurality of resistors includes eight resistors having values chosen so as to provide a four-level staircase approximation to a cosine waveform at the output of the second amplifier.

13. The circuitry of claims 10 or 12 wherein the first and second amplifier circuits each include differential amplifiers having inverting and non-inverting inputs thereto; an wherein individual ones of the first and second pluralities of resistors are connected to the inverting and non-inverting inputs of the respective differential amplifiers to provide negative and positive portions of the sine and cosine waveform approximations.

14. The circuit of claim 13 further including means for resetting the counter at the end of the timer means output signal.

15. A method for providing, in response to a periodic input signal of variable frequency, first and second output signals suitable for application to an air core meter means, having first and second input terminals, to provide an output indication of the frequency of the input signal, comprising the steps of:

defining an initialization period having a duration determined by the frequency of the periodic input signal;

providing first and second signals respectively representative of cosine and negative sine waveforms synchronous with the periodic input signal;

defining an aperture period following the initialization period;

applying a reference signal to the second input terminal during the initialization period;

applying the first signal and the second signal to the first and second input terminals during the aperture period; and repetitively defining initialization and aperture periods in response to the input signal so as to provide the first and second output signals representative of the frequency of the periodic input signal.

16. A method for providing, in response to a periodic input signal of variable frequency, first and second output signals indicative of the frequency of the input signal, comprising the steps of:

providing first and second signals which are respectively representative of cosine and negative sine waveforms, and which have a predetermined phase relationship with the input signal;

providing a pulse signal having a duration which is determined by the period of the input signal;

applying a reference signal to a first output terminal for the duration of the pulse signal;

defining an aperture interval following the end of said pulse signal; and applying the first and second waveforms to a second output terminal during the aperture interval.

17. The method of claims 15 or 16 wherein the first and second output signals are such that the arctangent of the ratio of the signals is proportional to the input frequency.

18. The method of claim 17 wherein the step of providing first and second signals includes the steps of:

sequentially counting through a plurality of states and providing a plurality of count outputs representative of the present state; and providing, in response to said count outputs, signals representative of sine and cosine waveforms which are synchronous with the periodic input signal.

19. The method of claim 18 further including the step or providing staircase approximations of sine and cosine waveforms in response to and synchronous with successive count outputs representative of sequential states.

* * * * *